United States Patent
Liu et al.

(10) Patent No.: US 11,550,012 B2
(45) Date of Patent: Jan. 10, 2023

(54) MAGNETIC RESONANCE IMAGING APPARATUS AND IMAGING PROCESSING METHOD FOR DETERMINING A REGION TO WHICH PROCESSING IS TO BE PERFORMED

(71) Applicant: CANON MEDICAL SYSTEMS CORPORATION, Otawara (JP)

(72) Inventors: Ye Liu, Beijing (CN); Bin Fu, Beijing (CN); Bing Li, Beijing (CN)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/437,558

(22) Filed: Jun. 11, 2019

(65) Prior Publication Data
US 2019/0377048 A1    Dec. 12, 2019

(30) Foreign Application Priority Data

Jun. 11, 2018  (CN) .......................... 201810595898.X
Jun. 7, 2019   (JP) ............................. JP2019-107057

(51) Int. Cl.
*G01R 33/56*      (2006.01)
*G01R 33/483*     (2006.01)
(Continued)

(52) U.S. Cl.
CPC ..... *G01R 33/5608* (2013.01); *G01R 33/4835* (2013.01); *G01R 33/56341* (2013.01);
(Continued)

(58) Field of Classification Search
None
See application file for complete search history.

(56) References Cited

U.S. PATENT DOCUMENTS

| 6,765,570 B1 * | 7/2004 | Cheung ................... G06T 15/08 |
| | | 715/848 |
| 2007/0223832 A1 * | 9/2007 | Matsumoto ............. G06T 5/006 |
| | | 382/260 |

(Continued)

FOREIGN PATENT DOCUMENTS

JP    2012-249676    12/2012

OTHER PUBLICATIONS

Northam et al., "Interhemispheric temporal lobe connectivity predicts language impairment . . . ", Nov. 11, 2012.*

(Continued)

*Primary Examiner* — Jeffrey J Chow
(74) *Attorney, Agent, or Firm* — Oblon, McClelland, Maier & Neustadt, L.L.P.

(57) ABSTRACT

A magnetic resonance imaging apparatus according to an embodiment executes a first imaging prior to a second imaging and includes processing circuitry. The processing circuitry receives, on a first image obtained from the first imaging, a setting of a region in which an RF (Radio Frequency) pulse is to be applied to a subject, generates a three-dimensional image based on the first image, determines, based on an imaging purpose of the second imaging, a translucent region to which translucent processing is to be performed in the three-dimensional image, and displays the translucent region, making the translucent region translucent in the three-dimensional image.

18 Claims, 10 Drawing Sheets

(51) Int. Cl.
  *G01R 33/563* (2006.01)
  *G06T 15/08* (2011.01)
(52) U.S. Cl.
  CPC ........ *G01R 33/56366* (2013.01); *G06T 15/08* (2013.01); *G06T 2200/24* (2013.01); *G06T 2210/41* (2013.01); *G06T 2210/62* (2013.01)

(56) References Cited

U.S. PATENT DOCUMENTS

| | | | | |
|---|---|---|---|---|
| 2007/0293755 | A1* | 12/2007 | Shirahata | A61B 6/032 600/425 |
| 2008/0298660 | A1* | 12/2008 | Yamagata | G01S 15/899 600/437 |
| 2012/0183191 | A1* | 7/2012 | Nakamura | A61B 5/416 382/128 |
| 2012/0209110 | A1* | 8/2012 | Bankiewicz | A61B 5/4064 600/431 |
| 2014/0047378 | A1* | 2/2014 | Hirakawa | G06T 15/08 715/782 |
| 2015/0190107 | A1* | 7/2015 | Kim | A61B 6/032 600/407 |
| 2015/0199121 | A1* | 7/2015 | Gulaka | A61B 6/463 715/771 |
| 2016/0063707 | A1* | 3/2016 | Masumoto | A61B 34/10 345/441 |
| 2016/0225181 | A1* | 8/2016 | Park | G06T 15/08 |
| 2017/0186200 | A1* | 6/2017 | Utsunomiya | G06T 11/60 |
| 2017/0261584 | A1* | 9/2017 | James | G01R 33/4835 |
| 2017/0285122 | A1* | 10/2017 | Kaditz | G01R 33/448 |
| 2020/0352542 | A1* | 11/2020 | Errico | A61B 8/488 |

OTHER PUBLICATIONS

Tovar-Moll et al, Structural and functional brain rewiring . . . , May 27, 2014.*

* cited by examiner

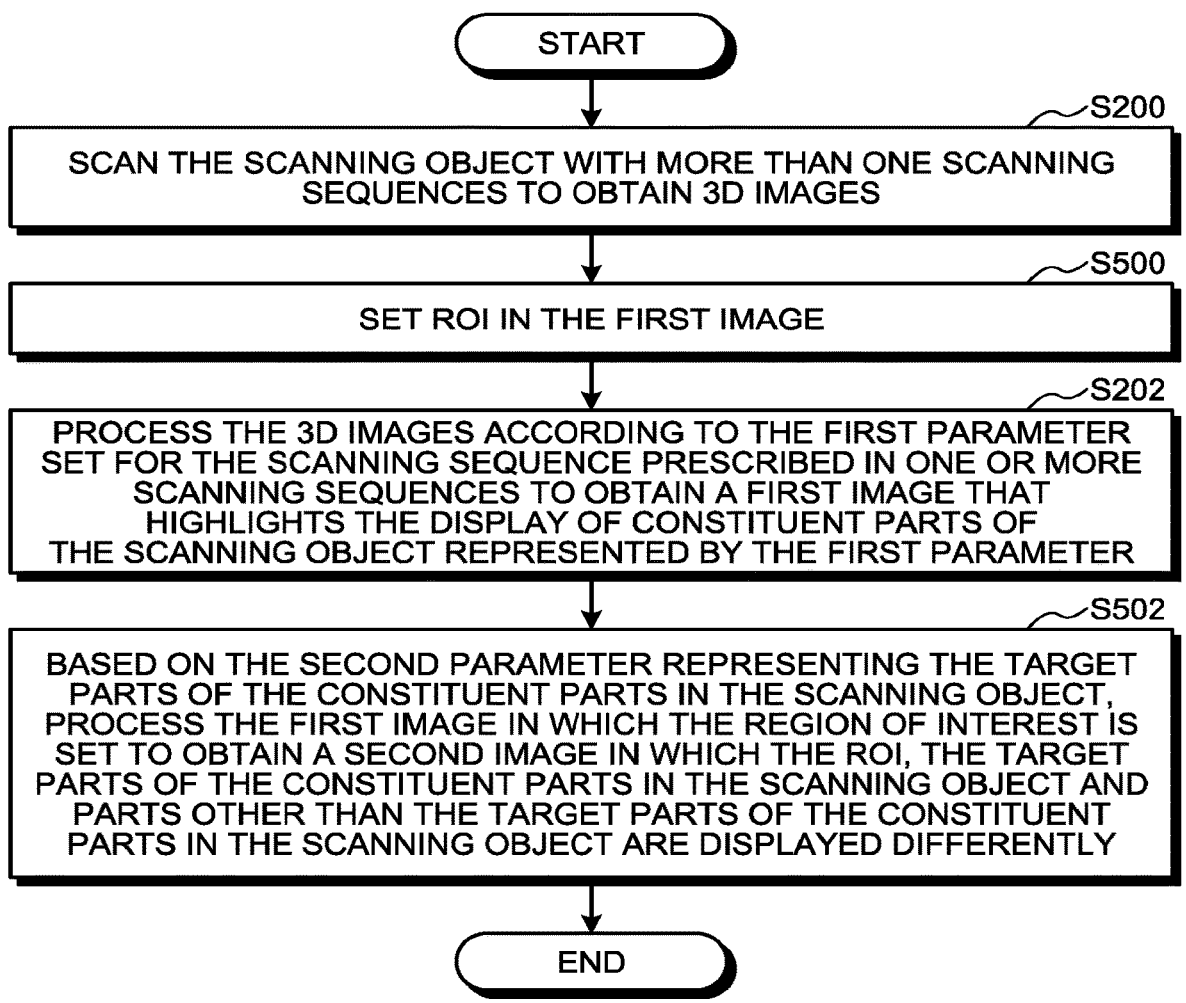

FIG.7A
FIG.7B
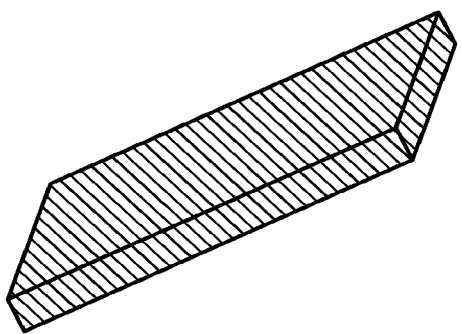
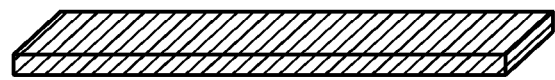

MAGNETIC RESONANCE IMAGING APPARATUS AND IMAGING PROCESSING METHOD FOR DETERMINING A REGION TO WHICH PROCESSING IS TO BE PERFORMED

CROSS-REFERENCE TO RELATED APPLICATIONS

This application is based upon and claims the benefit of priority from Chinese Patent Application No. 201810595898.X, filed on Jun. 11, 2018, and Japanese Patent Application No. 2019-107057, filed on Jun. 7, 2019; the entire contents of which are incorporated herein by reference.

FIELD

Embodiments described herein relate generally to a magnetic resonance imaging apparatus and image processing method.

BACKGROUND

In magnetic resonance imaging, it is sometimes the case that a graphical slice positioning is performed in which the position of a slice is determined by displaying an image.

As for the graphical slice positioning in the magnetic resonance imaging, it is often the case that two-dimensional graphical slice positioning is performed in which the position of a slice is determined based on a two-dimensional view. As an example, in each of three windows, each of the coronal plane positioning image, the sagittal plane positioning image and the axial plane positioning image is displayed and based on the displayed image, the slice positioning is performed.

However, operations regarding two-dimensional graphical slice positioning are not intuitive and sometimes require mastery.

BRIEF DESCRIPTION OF THE DRAWINGS

FIG. 6 is a flowchart of a magnetic resonance imaging method executed by a magnetic resonance imaging apparatus according to a modification example of the second embodiment.

FIG. 7A, FIG. 7B, FIG. 7C and FIG. 7D are examples of screens that a magnetic resonance imaging apparatus according to a modification example of the second embodiment displays.

DETAILED DESCRIPTION

Figure 1:
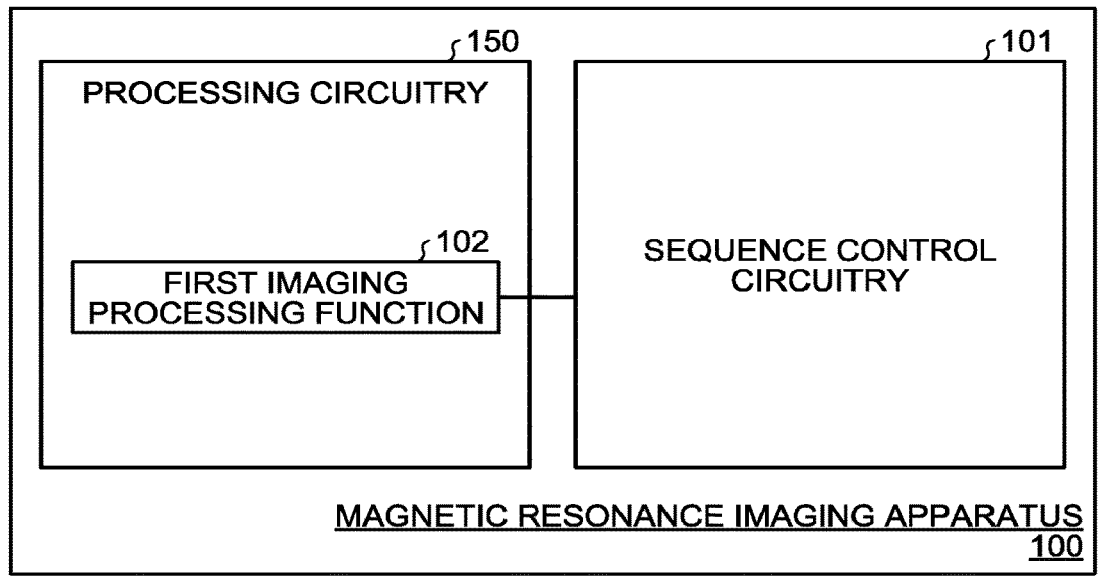
FIG. 1 is a diagram illustrating a magnetic resonance imaging apparatus according to a first embodiment.

A magnetic resonance imaging apparatus according to an embodiment executes a first imaging prior to a second imaging and includes processing circuitry. The processing circuitry receives, on a first image obtained from the first imaging, a setting of a region in which an RF (Radio Frequency) pulse is to be applied to a subject, generates a three-dimensional image based on the first image, determines, based on an imaging purpose of the second imaging, a translucent region to which translucent processing is to be performed in the three-dimensional image, and displays the translucent region, making the translucent region translucent in the three-dimensional image.

First of all, background according to an embodiment is briefly explained.

Currently, in magnetic resonance imaging, graphical slice positioning has been widely applied. Graphical slice positioning is a reference-images-based graphic interface, which can visualize and define graphical scanning objects such as slice groups of magnetic resonance scanning (or a subject).

In prior art, two dimensional graphical positioning mode is commonly applied in present magnetic resonance imaging graphical slice positioning. That is, positioning images displayed on three windows respectively are those of the coronal plane, the sagittal plane and the axial plane. The positioning of a graphical scanning object in three dimensional space, namely the position, direction etc. of the scanning object to be examined on a section, is modified by dragging and moving, zooming in, zooming out, adding and deleting the scanning object, and adjusting projections associated with each other of said graphical scanning object on the positioning image plane with a mouse in the 2D views of the graphic interface.

However, this kind of prior art 2D graphical positioning cannot provide 3D reference images for providing intuitive slice positioning display for the operator. Therefore, positioning adjustments made by the operator in the 2D positioning image for the purpose of obtaining the object graphical slice positioning would accordingly change positioning of the slice in 3D space. However, position and direction of a slice in 3D space need to be predetermined by the operator according to projections of 2D positioning images as to whether satisfying the requirements and covering the target region (ROI, region of interest). However, prior art 2D graphical positioning mode suffers disadvantages such as non-intuitive display and manipulation, long studying period for a green hand and no-easy-to-operation. Further, since the 2D graphical slice positioning mode is commonly applied for present magnetic resonance imaging graphical positioning, the operator needs to position on 2D planes and imagine the scenario of back projecting them into 3D space. This kind of operations are not intuitive and can achieve ideal effect only after repeated adjustments, which results in poor operability and long time consumed.

Additionally, recently a technical solution for improving said solution has been proposed. That is, operation results are presented by 3D visualization and some 3D image operation tools are provided to operate on these graphical scanning objects in 3D image space directly and set ROI etc.

However, in the improved solution, although a 3D reference image may be obtained, only an approximate position in space can be known from such 3D reference image. It is impossible to obtain detail information on intersection between the 3D reference image and ROI and thus the user cannot intuitively determine whether the ROI is set in the region he or she want to focus on.

Further, in MR scanning, there are many kinds of scanning sequences. For example, the scanning sequence DWI (Diffusion Weighted Imaging) is often used in detection of acute cerebral infarction, and in positioning of DWI scanning sequence, brain soft tissue such as the location of AC-PC (Anterior Commissure-Posterior Commissure) should be referred to. The scanning sequence ASL (Arterial Spin Labeling) may be used for imaging blood perfusion in brain. In positioning for ASL scanning sequence, locations of brain blood vessels should be referred to. In other words, when executing a scanning sequence labeling blood such as ASL method, the labeled region needs to be set according to the position of the brain blood vessels. When setting the labeled region, in positioning for scanning sequence CSF (cerebrospinal fluid), locations of hydrops, plaques, edemas needs to be taken into consideration. In other words, when executing a scanning sequence for observing CSF, a labeled region for labeling the CSF needs to be set according to the locations of hydrops, plaques, or edemas. As described above, the constitute tissues of the focused (to be referred to) objects (organs such as liver, tissues such as grey matter, brain vessels) are different for positioning in different scanning sequences. Therefore, in order to view different constituting tissues of scanning objects (organs such as liver, tissues such as grey matter, brain vessels), differentiated 3D rendering is needed to blank out constituting parts of the scanning object that need not be seen or weaken their display while emphasizing (highlighting) constitute parts of the scanning object that need to be seen. For example, when the tissues, such as grey matter and white matter, need to be seen, the harnpan surface should be blanked out by 3D rendering. Otherwise, tissues such as grey matter and white matter can not be seen.

However, in prior art technology, there is no technique for 3D rendering according to different objects of interest of scanning (imaging) sequences automatically.

Further, at present, while performing saturation operation, scanning operation, marking operation or pre-saturation operation, it is necessary to precisely position the constituent parts of the scanning object to be operated, to precisely determine detail information on the intersection between the ROI and the 3D image of the scanning object, and to determine precisely the relative position relationship between the ROI and the constituent parts of the scanning object. In other words, when setting the application region of an RF pulse, the relationship between the scanned object that is the target of application of the RF pulse and the surrounding tissues regarding the scanned object needs to be taken into consideration. The application region of the RF pulse includes, for example, a saturation region to suppress signals from tissues that are not necessary for diagnosis, a labeled region for labeling blood flow or CSF, and a region in which tags in lattice shape are applied by tagging MRI, which is used for myocardium motion evaluation.

Further, recently, in magnetic resonance imaging, local excitation pulse imaging has become a hot point. Magnetic resonance imaging in the future will be small visual field and high resolution imaging. However, there are the following problems with the present magnetic resonance imaging technology for realizing small visual field and high resolution local excitation pulse imaging: lacking intuitive detail information on the view, relying only on the user's spatial imagination for adjustments for positioning and the next scanning, and being incapable of precise positioning of small regions.

First Embodiment

The magnetic resonance imaging apparatus 100 according to the first embodiment will be described below.

[Constituents of Magnetic Resonance Imaging Apparatus 100]

Figure 2:
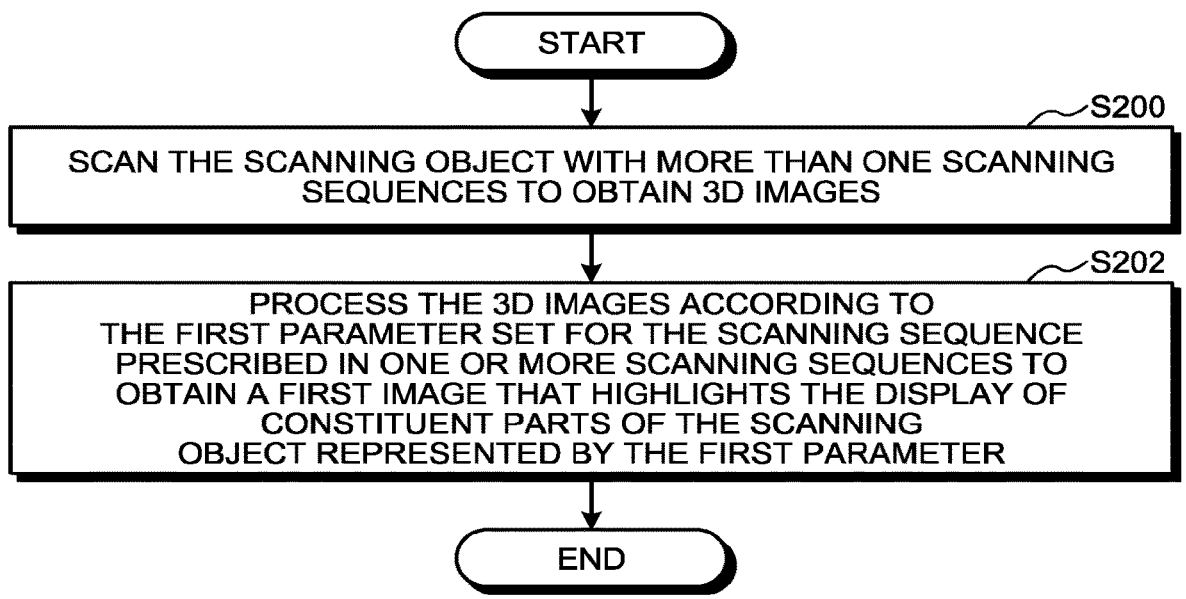
FIG. 2 is a flowchart of a magnetic resonance imaging apparatus according to the first embodiment.

First, the magnetic resonance imaging apparatus 100 of the first embodiment will be described with reference to FIGS. 1 and 2. FIG. 1 is a block diagram of a magnetic resonance imaging apparatus 100 according to the first embodiment. FIG. 2 is a flow chart of a magnetic resonance imaging method performed by the magnetic resonance imaging apparatus 100 according to the first embodiment.

Further, the magnetic resonance imaging apparatus 100 includes various components and FIG. 1 only shows components related to the technical idea of the present invention and omits others.

As shown in FIG. 1, the magnetic resonance imaging apparatus 100 has sequence control circuitry 101 and processing circuitry 150.

The sequence control circuitry 101 scans the scanning object of magnetic resonance imaging (hereinafter, scanning object sometimes) such as the head of a human to acquire 3D images of the scanning object. The sequence control circuitry 101 scans the scanning object with one or more scanning sequence. The scanning sequence here may be for example DWI scanning sequence but the embodiment is not limited to DWI scanning sequence. The scanning sequence may be a scanning sequence employing ASL method, or a scanning sequence for observing CSF. In addition, the sequence control circuitry 101 may acquire volume data as 3D data. In addition, the sequence control circuitry 101 may also acquire multi-slice data as 3D data. The sequence control circuitry 101 is an example of a scanning unit.

In addition, here, the scanning sequence may be preset when the magnetic resonance imaging apparatus leaves the manufactory, or set as desired before or when the user uses the magnetic resonance imaging apparatus 100, and may also be modified during using the magnetic resonance imaging apparatus 100 by user.

The processing circuitry has a first imaging processing function 102. In the first embodiment, each processing function executed by the first imaging processing function 102 is stored in memory (not illustrated) in the form of computer-executable program. The processing circuitry 150 is a processor that reads a program from the memory and executes the program, thereby realizing a function corresponding to the program. In other words, the processing circuitry 150 in a state of having read each of the programs has each of the functions illustrated in the processing circuitry 150 of FIG. 1. In FIG. 1, it is explained that the function executed by the first imaging processing function 102 is realized by a single processing circuitry. However, a plurality of independent processors may be combined to form the processing circuitry 150 and each of the plurality of independent processors may execute each program to realize the function. Each function described above may be implemented as each program and a single processing circuitry 150 may execute each program. Alternatively, a specific function may be implemented on a dedicated independent program execution circuitry. It is noted that in FIG.

1, the first imaging processing circuitry 120 is an example of a generation unit. Further, memory (not illustrated) is an example of a storage unit.

The word "processor" as used in the explanation above means circuitry such as, for example, CPU (Central Processing Unit), GPU (Graphical Processing Unit), ASIC (Application Specific Integrated Circuit), programmable logic device (e.g. SPLD (Simple Programmable Logic Device), CPLD (Complex Programmable Logic Device) and FPGA (Field Programmable Gate Array)). The processor reads the programs stored in the memory and execute the programs to realize the functions.

The processing circuitry 150 performs, by the first imaging processing function 102, imaging processing of the 3D images obtained by the sequence control circuitry 101 according to the first parameter set for the scanning sequence prescribed in one or more scanning sequences to obtain a first image that highlights the display of constituent parts of the scanning object represented by the first parameter. Herein, the prescribed scanning sequence is the scanning sequence in one or more scanning sequences with which the sequence control circuitry 101 scans the scanning object. Additionally, the prescribed scanning sequence is not limited to one scanning sequence. In addition, for the prescribed scanning sequence, a first parameter is set which may be for example representative of constituent parts of the scanning object of interest while scanning the scanning object with the prescribed scanning sequence. In other words, the first parameter is, for example, a parameter specifying a specific constituent part of the scanning object.

In addition, similarly to the above-described scanning sequence, the first parameter may be preset when the magnetic resonance imaging apparatus leaves the manufactory or set as desired before or when the user uses the magnetic resonance imaging apparatus 100, and may be modified during using the magnetic resonance imaging apparatus 100 by user.

In addition, although not shown, the magnetic resonance imaging apparatus 100 may of course be equipped with a display unit (display) that is built-in or externally connected for displaying images obtained by the sequence control circuitry 101 and the first imaging processing function 102. However, as to the display, it is not the core technical idea of the present invention and will not be illustrated.

[Magnetic Resonance Imaging Method Performed by the Magnetic Resonance Imaging Apparatus 100]

Herein below, the magnetic resonance imaging method performed by the magnetic resonance imaging apparatus 100 will be described with reference to FIG. 2.

As shown in FIG. 2, after beginning operation, the magnetic resonance imaging apparatus 100 firstly, in step S200, scans the scanning object, namely the head of a human, with the sequence control circuitry 101 to obtain 3D images related to the scanning object, and then proceeds to step S202.

Next, in step S202, the processing circuitry 150 performs, by the first imaging processing function 102, imaging processing to the 3D images obtained by the sequence control circuitry 101 according to the first parameter set for the scanning sequence prescribed in one or more scanning sequences to obtain a first image that highlights the display of constituent parts of the scanning object represented by the first parameter. Herein, it is assumed that the scanning sequence and the first parameter are preset before the user uses the magnetic resonance imaging apparatus 100 and then the processing is ended. Hereinbelow, a specific example of the first embodiment will be described.

First, it is assumed that the scanning sequence and the first parameter are preset before the user uses the magnetic resonance imaging apparatus 100. Further, it is assumed that the scanning sequences include one or more scanning sequences related to scanning osseous tissue such as skeleton, soft tissues such as muscles, blood vessels, aqueous tissues such as edemas and hydrops. And the scanning sequence preset as the prescribed scanning sequence is the DWI scanning sequence for imaging grey matter and white matter. In addition, for the prescribed scanning sequence, the preset first parameter represents constituent parts of the scanning object of interest that are related to grey matter and white matter while scanning the scanning object with the prescribed scanning sequence.

Based on this, after beginning operation, the magnetic resonance imaging apparatus 100 scans the scanning object (here assumed to be the head of a human) with the sequence control circuitry 101 to obtain 3D images related to the scanning object. Here, for example, the obtained 3D images of the scanning object include harnpan and grey matter, white matter, brain blood vessels covered by the harnpan.

Subsequently, the magnetic resonance imaging apparatus 100 imaging processes, with the first imaging processing function 102, the 3D images obtained by the sequence control circuitry 101 according to the first parameter set for the scanning sequence (i.e. the DWI scanning sequence) prescribed in one or more scanning sequences to obtain a first image that highlights the display of constituent parts of the scanning object represented by the first parameter. For example, in the first image, the surface of harnpan is not displayed, while the grey matter, white matter represented by the first parameter set in the prescribed scanning sequence, namely DWI, are highlighted.

Here, the surface of harnpan is not displayed since the first imaging processing function 102 renders said 3D images in 3D according to the first parameter in which constituent parts of the scanning object that need not to be seen such as harnpan, blood vessels are blanked out by saturation processing or transparency (translucent) processing or clipping processing.

With the magnetic resonance imaging apparatus 100 according to the first embodiment, it is possible to subject 3D images to imaging processing such as 3D rendering automatically according to a prescribed scanning sequence and during scanning, it is possible to view tissues of interest, namely tissues that need to be viewed intuitively without user's operation. That is, it is possible to render different tissues automatically according to different scanning sequences and localize the constituent parts of the scanning object that need operation automatically and precisely.

Second Embodiment

Figure 3:
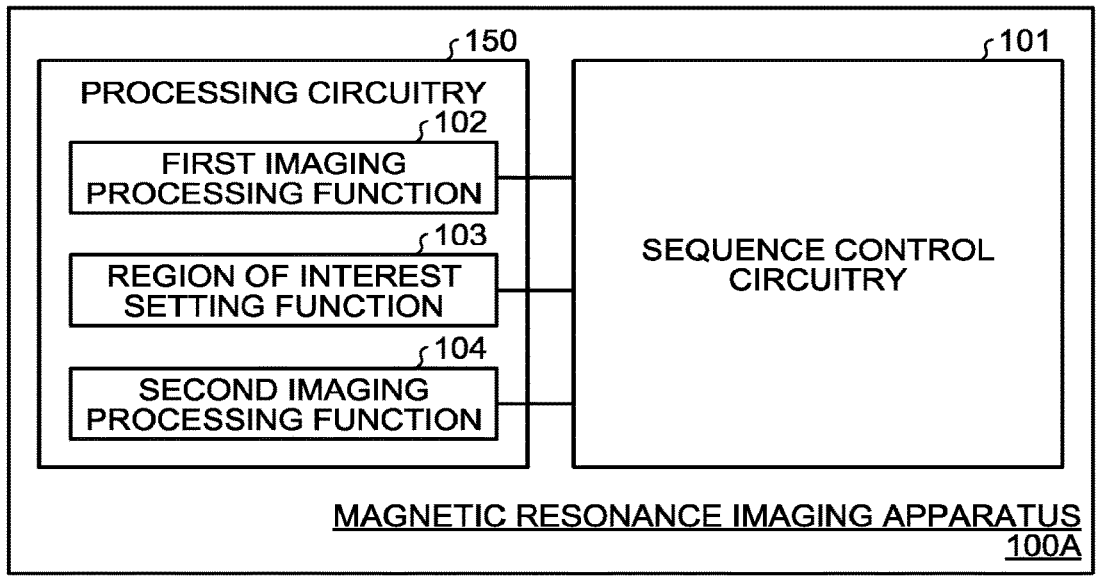
FIG. 3 is a diagram illustrating a magnetic resonance imaging apparatus according to a second embodiment.
Figure 4:
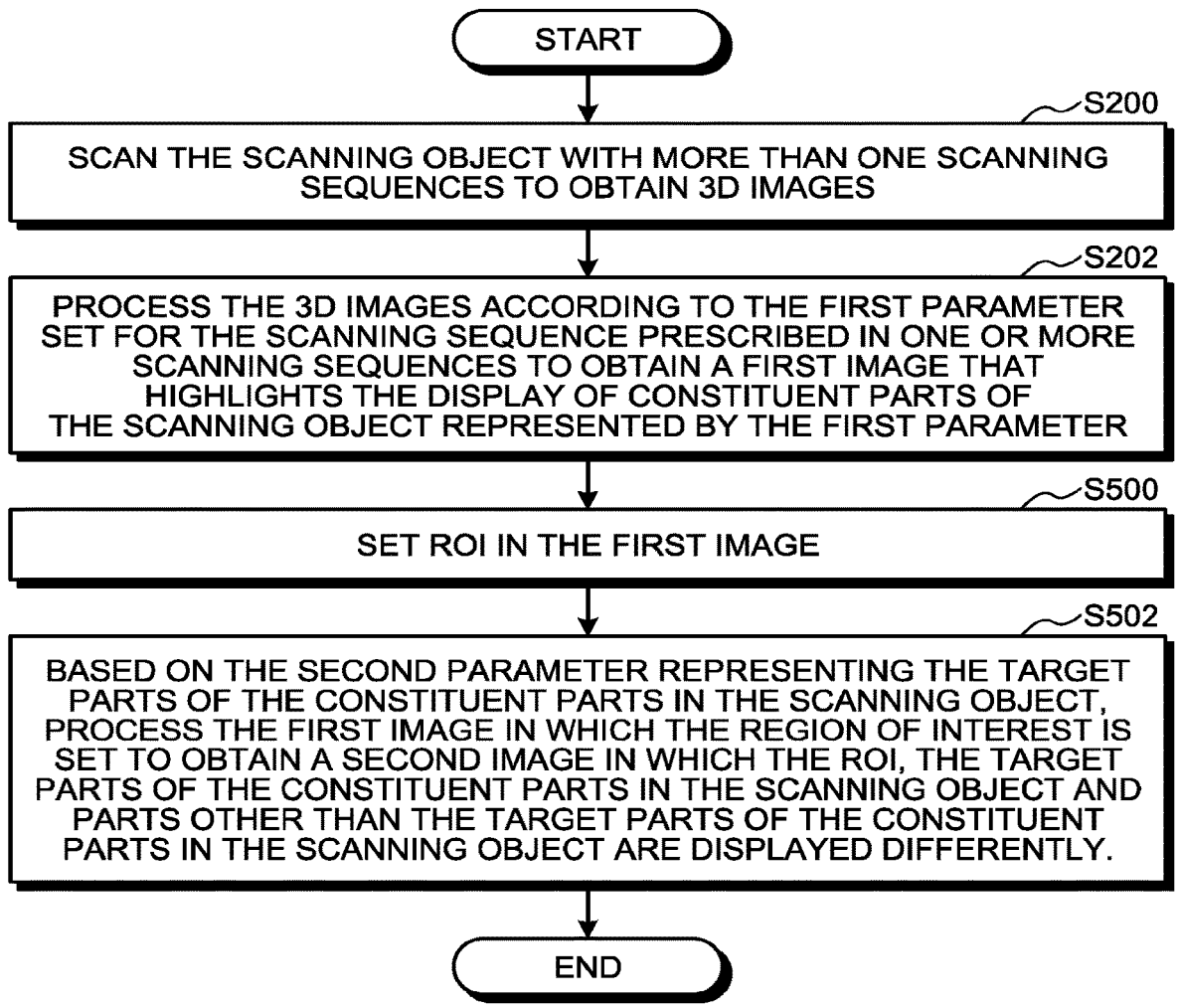
FIG. 4 is a flowchart illustrating a flow of processing executed by a magnetic resonance imaging apparatus according to the second embodiment.
Figure 5A:
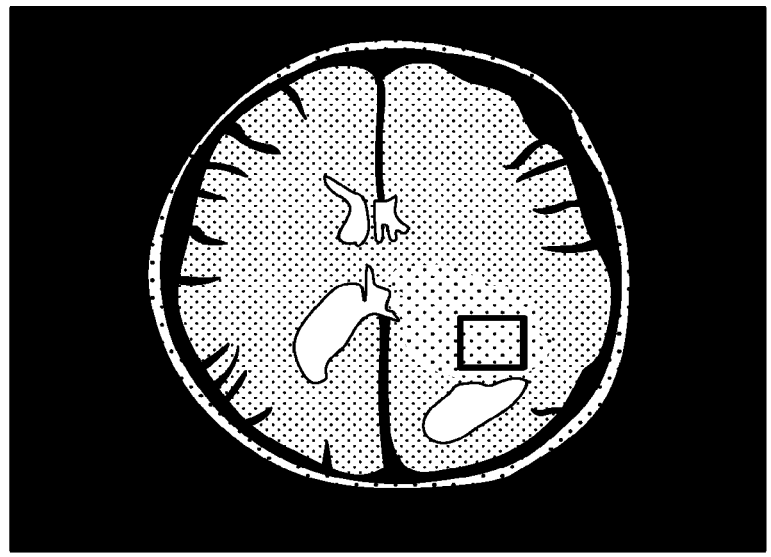
FIG. 5A and FIG. 5B are examples of screens that a magnetic resonance imaging apparatus according to the second embodiment displays.
Figure 5B:
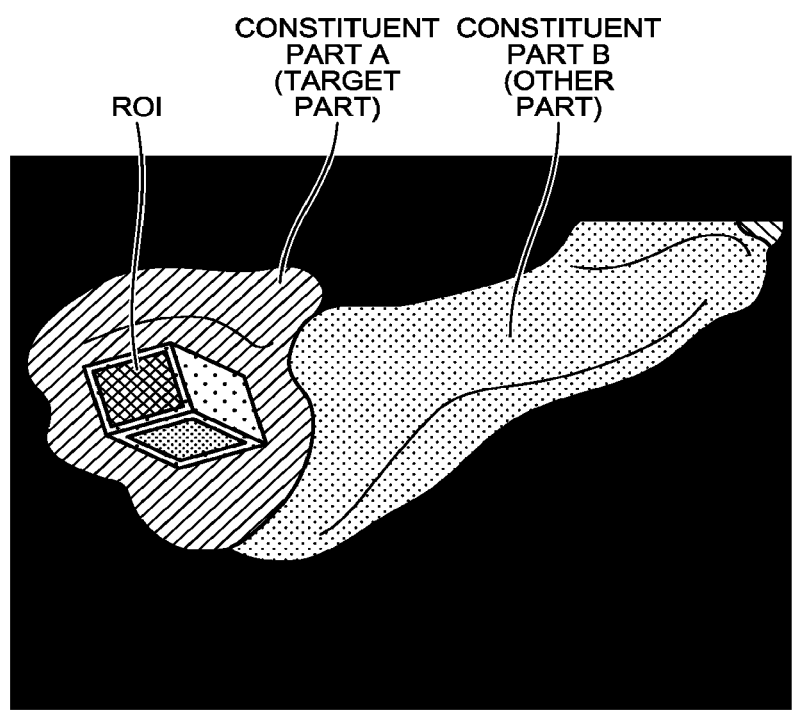

Hereinbelow, the magnetic resonance imaging apparatus 100A according to the second embodiment and modification thereof will be described with reference to FIGS. 3-7D. FIG. 3 is a block diagram of a magnetic resonance imaging apparatus 100A according to the second embodiment. FIG. 4 is a flow chart of a magnetic resonance imaging method performed by the magnetic resonance imaging apparatus 100A according to the second embodiment. FIGS. 5A and 5B are diagrams of one display example of the magnetic resonance imaging apparatus 100A according to the second embodiment. FIG. 6 is a flow chart of a magnetic resonance imaging method performed by the magnetic resonance imaging apparatus 100A according to a modification of the second embodiment. FIGS. 7A-7D are diagrams of a display example of the magnetic resonance imaging apparatus 100A according to a modification of the second embodiment.

[Constituents of Magnetic Resonance Imaging Apparatus 100A]

As compared to the magnetic resonance imaging apparatus 100 according to the first embodiment as shown in FIG. 1, as for the magnetic resonance imaging apparatus 100A according to the second embodiment as shown in FIG. 3, the processing circuitry 150 has a region of interest (ROI) setting function 103 and a second imaging processing function 104. Further, in the present embodiment, description of constituent elements same as those of the magnetic resonance imaging apparatus 100 are omitted.

In the second embodiment, the processing circuitry 150 has a first image processing function 102, a region of interest setting function 103 and a second imaging processing function 104. In the second embodiment, each processing function executed by the first imaging processing function 102, the region of interest setting function 103, and the second imaging processing function 104 is stored in memory (not illustrated) in the form of computer-executable program. The processing circuitry 150 is a processor that reads a program from the memory and executes the program, thereby realizing a function corresponding to the program. In other words, the processing circuitry 150 in a state of having read each of the programs has each of the functions illustrated in the processing circuitry 150 of FIG. 3. In FIG. 3, it is explained that the function executed by the first imaging processing function 102, the region of interest setting function 103 and the second imaging processing function 104 are realized by a single processing circuitry. However, a plurality of independent processors may be combined to form the processing circuitry 150 and each of the plurality of independent processors may execute each program to realize the function. Each function described above may be implemented as each program and a single processing circuitry 150 may execute each program. Alternatively, a specific function may be implemented on a dedicated independent program execution circuitry. It is noted that in FIG. 3, the first imaging processing circuitry 120 is an example of a generation unit. Further, the region of interest setting function 103 is an example of a reception unit. Further, memory (not illustrated) is an example of a storage unit.

Similarly to the first embodiment, the word "processor" as used in the explanation above means circuitry such as, for example, CPU (Central Processing Unit), GPU (Graphical Processing Unit), ASIC (Application Specific Integrated Circuit), programmable logic device (e.g. SPLD (Simple Programmable Logic Device), CPLD (Complex Programmable Logic Device) and FPGA (Field Programmable Gate Array). The processor reads the programs stored in the memory and execute the programs to realize the functions.

The ROI setting function 103 is configured to set ROI in the first image. The ROI setting function 103 may be a device capable of inputting such as a mouse, a keyboard, a joystick, a tracking ball, a touch screen, a light pen and a language controller etc. When using a touch screen, the processing circuitry 150 may, by the region of interest setting function 103, set the region of interest ROI on the 3D image displayed by the not shown display unit such as the touch screen according to the operation by the user such as a doctor. Further, when using a keyboard, the processing circuitry 150 may, by the region of interest setting function, set the region of interest ROI according to the coordinates of the ROI output by the keyboard operated by the user. Here, the region of interest refers to a region that needs one or more operations among the scanning operation, saturation operation, marking operation and pre-saturation operation. In other words, the region of interest is a region in which an RF pulse is applied. The region of interest includes, for example, an application region of a saturation pulse suppressing signals from tissues that are other than the target of observation, a labeled region for labeling fluid such as blood flow or CSF, a region in which tag pulses are applied in tagging MRI. However, the region of interest is not limited to these cases. The region of interest includes, in general, an application region of an RF pulse set by an operator.

The processing circuitry 150 performs, by the second imaging processing function 104, according to the second parameter, imaging processing of the first image in which the region of interest is set by the ROI setting function 103 to obtain a second image in which the ROI, the target parts of the constituent parts in the scanning object and parts other than the target parts of the constituent parts in the scanning object are displayed differently.

The second parameter represents target parts of the constituent parts of the scanning object. In addition, similarly to the first parameter, the second parameter may be preset when the magnetic resonance imaging apparatus 100A leaves the factory, or set as desired before or when the user uses the magnetic resonance imaging apparatus 100A, and may be modified during using the magnetic resonance imaging apparatus 100A by user. Further, the second parameter may be same as the first parameter.

[Magnetic Resonance Imaging Method Performed by the Magnetic Resonance Imaging Apparatus 100A]

The magnetic resonance imaging method performed by the magnetic resonance imaging apparatus 100A will be described with reference to FIG. 4. Here, steps same as those in the flow chart shown in FIG. 2 are denoted with same numerals and detail description thereof will be omitted.

As shown in FIG. 4, after beginning operation, similarly to the magnetic resonance imaging apparatus 100 of the first embodiment, the magnetic resonance imaging apparatus 100A of the present embodiment carries out acts of steps S200-S202 and proceeds to step S500 after completing the act of step S202.

Next, in step S500, the magnetic resonance imaging apparatus 100A sets ROI in the first image with the ROI setting function 103 and then proceeds to step S502. In other words, at Step S500, the magnetic resonance imaging apparatus 100A having the processing circuitry 150 receives, by the reception unit as the region of interest setting function 103, on a first image obtained from the first imaging, a setting of a region in the second imaging in which an RF (Radio Frequency) pulse (e.g. a saturation pulse suppressing MR (Magnetic resonance) signals generated from a specific tissue) is to be applied to a subject. It is noted that the magnetic resonance imaging apparatus 100A executes the first imaging prior to the sec and imaging. Here, the first image is a two-dimensional image (or a plurality of two-dimensional images) which is, for example, obtained along a plurality of axes. Alternatively, the first image is volume data.

In step S502, the processing circuitry 150 performs, by the second imaging processing function 104, according to the second parameter, imaging processing of the first image in which the region of interest is set by the ROI setting function 103 to obtain a second image in which the ROI, the target parts of the constituent parts in the scanning object and parts other than the target parts of the constituent parts in the scanning object are displayed differently. Then the processing is ended.

Hereinbelow, a specific example of the second embodiment will be described with reference to FIGS. 5A and 5B. First of all, as to the setting of scanning sequence and first parameter, it is same as the description of the specific example in the above-described first embodiment and will not be described any more herein. In addition, as to the second parameter, it is assumed to represent the constituent part A of the scanning object. In addition, the constituent part A is one constituent part in images related to the grey matter and white matter according to the specific example of the first embodiment.

Based on this, after beginning operation, the sequence control circuitry 101 scans the scanning object, namely the head of a human, with the sequence control circuitry 101 to obtain e.g. 3D images related to the scanning object. Here, the obtained 3D images of the scanning object include harnpan and grey matter, white matter, brain blood vessels covered by the harnpan. In other words, the magnetic resonance imaging apparatus 100A generates, by the first imaging processing function 102 as the generation unit, a three-dimensional image based on the first image obtained from the first imaging.

Subsequently, the magnetic resonance imaging apparatus 100A performs, by the first imaging processing function 102, imaging processing of the 3D images obtained by the sequence control circuitry 101 according to the first parameter set for the scanning sequence (i.e. DWI scanning sequence) prescribed in one or more scanning sequences to obtain a first image that highlights the display of constituent parts of the scanning object represented by the first parameter. For example, in the first image, the surface of harnpan is not displayed, while the grey matter, white matter represented by the first parameter set in the prescribed scanning sequence, namely DWI, are highlighted by the first imaging processing function 102 of the processing circuitry 150.

Subsequently, the user sets the ROI in the first image by the ROI setting function 103. After the user's act of setting ROI, it is possible to prompt the user to indicate the image of ROI on the first image. Here, for example, as shown in FIG. 5A, it is possible to indicate the ROI set by the user with a box on the 2D image of the scanning object.

Subsequently, the processing circuitry 150 performs, by the second imaging processing function 104, according to the second parameter, imaging processing of the first image in which the region of interest is set by the ROI setting function 103 to obtain a second image in which the ROI, the target parts of the constituent parts in the scanning object and parts other than the target parts of the constituent parts in the scanning object are displayed differently, as shown in FIG. 5B.

As shown in FIG. 5B, the processing circuitry 150 displays differently, by the second imaging processing function 104, in the second image, the ROI, the target parts of constituent parts in the scanning object based on the preset second parameter, namely the constituent part A, and parts other than the target parts of the constituent parts in the scanning object, namely part B. It is needless to say that, as the magnetic resonance imaging apparatus 100A, it is possible to provide only the image in FIG. 5B to the user, and it is also possible to provide both images in FIG. 5A and FIG. 5B to the user.

With the magnetic resonance imaging apparatus 100A according to the second embodiment, in addition to the effect of the above-described first embodiment, the ROI is further set, and the first image in which the region of interest is set undergoes imaging processing according to the second parameter to obtain a second image in which the ROI, the target parts of the constituent parts in the scanning object and parts other than the target parts of the constituent parts in the scanning object are displayed differently. Therefore, it is possible to display constituent parts of the scanning object that the user cares about (the anatomy) by 3D rendering automatically and directly such that the user may view very intuitively the relative position relationship among the set ROI and the constituent part in the scanning object as the target part based on the preset second parameter, as well as part other than the target part of the constituent parts in the scanning object and intuitively determine whether the set ROI is precisely positioned at the appropriate location in the scanning object.

Modification of the Second Embodiment

Hereinbelow, the magnetic resonance imaging apparatus 100A according to the modification of the second embodiment will be described with reference to FIGS. 6-7D.

The modification of the magnetic resonance imaging apparatus 100A has a configuration substantially identical to that of the magnetic resonance imaging apparatus 100A of the second embodiment except that the second imaging processing function 104 in the modification further highlights the intersection region between the ROI and the first image in the second image in addition to imaging processing the first image in which the region of interest is set by the ROI setting function 103 according to the second parameter to obtain a second image in which the ROI, the target parts of the constituent parts in the scanning object and parts other than the target parts of the constituent parts in the scanning object are displayed differently as described in the second embodiment. Therefore, repeated description will be omitted here and differences will be described mainly.

[Magnetic Resonance Imaging Method Performed by the Magnetic Resonance Imaging Apparatus 100A]

The magnetic resonance imaging method performed by the modification of the magnetic resonance imaging apparatus 100A is as shown in FIG. 6. The flow chart shown in FIG. 6 differs from that shown in FIG. 4 only in the order of steps while act of each step is not changed. Therefore, the description before may be referred to and detail description will be omitted here.

Figure 7C:

Hereinbelow, a specific example of the modification of the second embodiment will be described with reference to FIGS. 7A-7D. FIG. 7A is a diagram of a 3D image of the scanning object, FIG. 7B is a diagram of the ROI, FIG. 7C is a diagram of the first image, and FIG. 7D is a diagram of the second image.

First, it is also assumed that the scanning sequence, the first parameter and the second parameter are preset before the user uses the magnetic resonance imaging apparatus 100A. Further, it is assumed that the scanning sequences include one or more scanning sequences related to osseous tissue such as skeleton, soft tissues such as muscles, blood vessels, aqueous tissues such as edemas and hydrops. And it is predetermined that the prescribed scanning sequence is a scanning sequence for imaging the liver. In addition, for the prescribed scanning sequence, the preset first parameter represents that the constituent part of the scanning object of interest is liver while scanning the scanning object with the prescribed scanning sequence.

Based on this, after beginning operation, the magnetic resonance imaging apparatus 100A scans the scanning object, namely the torso of a human, by the sequence control circuitry 101 to obtain e.g. 3D images related to the scanning object as shown in FIG. 7A. Herein, the 3D image of the scanning object as shown in FIG. 7A includes organs such as liver and heart.

Subsequently, the user sets two ROIs as shown in FIG. 7B in the first image by the ROI setting function 103.

In turn, the magnetic resonance imaging apparatus 100A imaging processes, with the first imaging processing function 102, the 3D images obtained by the sequence control circuitry 101 according to the first parameter set for the scanning sequence prescribed in the one or more scanning sequences to obtain a first image that highlights the display of constituent parts of the scanning object represented by the first parameter as shown in FIG. 7C. In the first image shown in FIG. 7C, the heart is displayed with a certain transparency, while the liver represented by the first parameter set for the prescribed scanning sequence is highlighted.

Figure 7D:
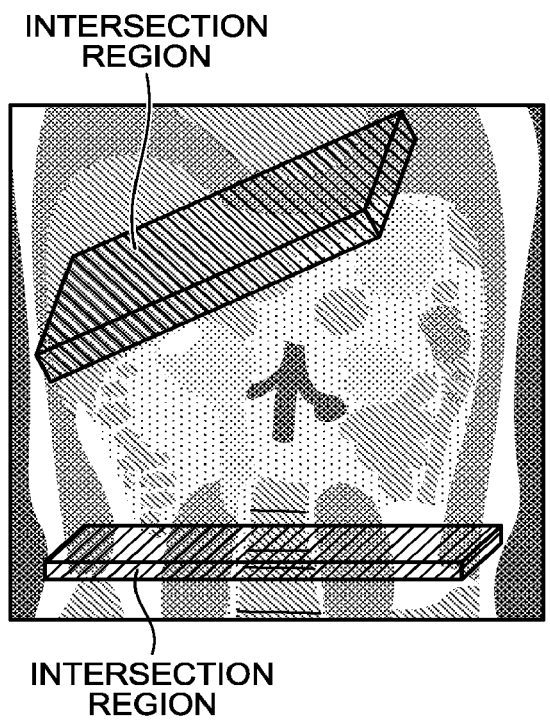

Subsequently, the processing circuitry 150 performs, by the second imaging processing function 104, imaging of the first image in which the region of interest is set by the ROI setting function 103 according to the second parameter to obtain a second image in which the ROI, the target parts of the constituent parts in the scanning object and parts other than the target parts of the constituent parts in the scanning object are displayed differently, as shown in FIG. 7D. In addition, in the second image, the intersection region between the ROI and the first image as shown in FIG. 7B is highlighted.

As shown in FIG. 7D, in the second image, in addition to displaying the ROI, the target parts of constituent parts in the scanning object based on the preset second parameter, namely the constituent part, and parts other than the target parts of the constituent parts in the scanning object, namely the constituent part, with different transparencies, the intersection region between the ROI and the first image is highlighted by the second imaging processing function 104 of the processing circuitry 150. In other words, the processing circuitry 150 determines, by the second imaging processing function 104 as the control unit, based on an imaging purpose of the second imaging (e.g. the type of imaging sequence used in the second imaging, information of a body part to be imaged in the second imaging, the information of an anatomical body part that is an imaging target in the second imaging), a translucent region to which translucent processing in the three-dimensional image is to be performed and displays, by the second imaging processing function 104 as the display unit, the translucent region, making the translucent region translucent in the three-dimensional image. It is noted that the magnetic resonance imaging apparatus 100A may further comprise memory as the storage unit that stores information indicating correspondence between the imaging purpose and the translucent region and the processing circuitry 150 may read, by the second imaging processing function 104 as the controlling unit, from the memory, the translucent region that is chosen according to the imaging purpose in the second imaging.

With the magnetic resonance imaging apparatus 100A of the modification of the second embodiment, in addition to the effects of the above-described first and second embodiments, it is possible to further enhance the above-described effects since it is also possible to highlight the intersection region between the ROI set by the user (FIG. 7B) and the constituent parts of the scanning object (e.g., the first image) with 3D rendering such as colors or patterns.

Third Embodiment

Figure 8:
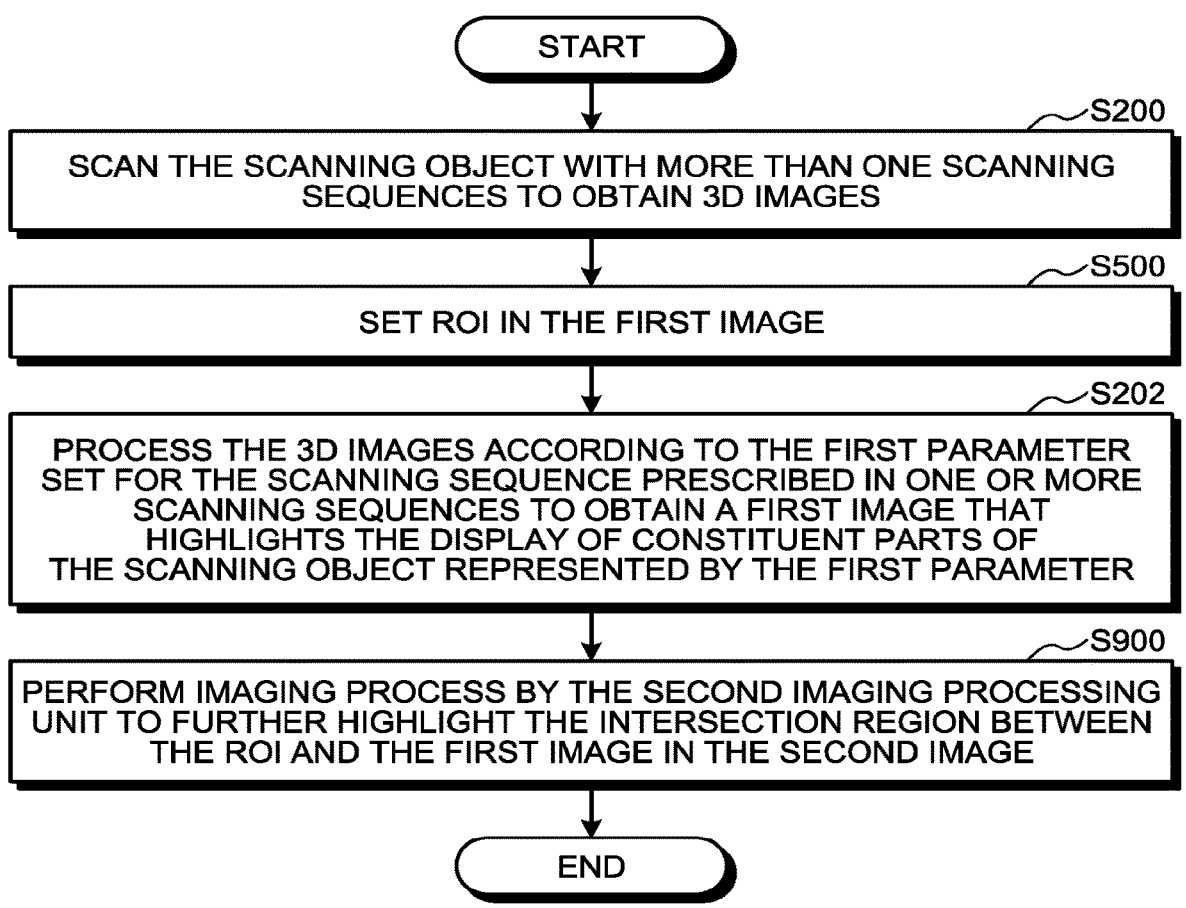
FIG. 8 is a flowchart of a magnetic resonance imaging method executed by a magnetic resonance imaging apparatus according to a third embodiment.
Figure 9A:
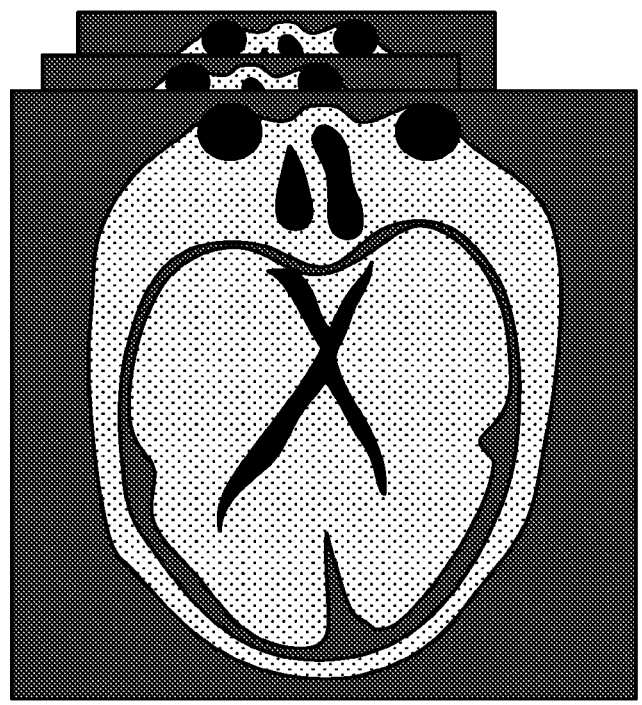
FIG. 9A, FIG. 9B, FIG. 9C and FIG. 9D are examples of screens that a magnetic resonance imaging apparatus according to the third embodiment displays.

Hereinbelow, the magnetic resonance imaging apparatus 100A according to the third embodiment will be described with reference to FIGS. 8-9D. FIG. 8 is a flow chart of a magnetic resonance imaging method performed by the magnetic resonance imaging apparatus 100A according to the third embodiment. FIGS. 9A-9D are diagrams of a display example of the magnetic resonance imaging apparatus 100A according to the third embodiment.

The magnetic resonance imaging apparatus 100A of the third embodiment has a configuration substantially identical to that of the magnetic resonance imaging apparatus 100A of the second embodiment except that the second imaging processing function 104 in the third embodiment is configured not only for imaging processing but also for obtaining the second image that highlights the intersection region between ROI and the first image. Therefore, repeated description will be omitted here and differences will be described mainly.

[Magnetic Resonance Imaging Method Performed by the Magnetic Resonance Imaging Apparatus 100A]

The magnetic resonance imaging method performed by the magnetic resonance imaging apparatus 100A is as shown in FIG. 8. The flow chart shown in FIG. 8 differs from that shown in FIG. 6 only in that step S900 replaces step S502. Acts of steps denoted with the same reference numerals are not changed and detail description will also be omitted here.

As shown in FIG. 8, after beginning operation, similarly to the modification of the magnetic resonance imaging apparatus 100A of the second embodiment, steps S200, S500 and S202 are performed and step S900 will be performed after completing step S202.

Subsequently, in step S900, the processing circuitry 150 performs, by the second imaging processing function 104, imaging processing to obtain the second image that highlights the intersection region between ROI and the first image and then end the processing.

Hereinbelow, a specific example of the third embodiment will be described with reference to FIGS. 9A-9D. FIG. 9A is a diagram of a 3D image of the scanning object, FIG. 9B is a diagram of the ROI, FIG. 9C is a diagram of the first image, and FIG. 9D is a diagram of the second image.

First, it is also assumed that the scanning sequence, the first parameter and the second parameter are preset before the user uses the magnetic resonance imaging apparatus 100A. Further, it is assumed that the scanning sequences include one or more scanning sequences related to osseous tissue such as skeleton, soft tissues such as muscles, blood vessels, aqueous tissues such as edemas and hydrops. And it is predetermined that the prescribed scanning sequence is a scanning sequence for imaging the blood vessels. In addition, for the prescribed scanning sequence, the preset first parameter represents that the constituent parts of the scanning object of interest is blood vessels while scanning the scanning object with the prescribed scanning sequence.

Based on this, after beginning operation, the magnetic resonance imaging apparatus 100A scans the scanning object, namely the brain of a human, with the sequence control circuitry 101 to obtain e.g. 3D images related to the scanning object as shown in FIG. 9A (step S200). Herein, the 3D image of the scanning object shown in FIG. 9A includes tissues such as blood vessels, grey matter, white matter and harnpan.

Figure 9B:
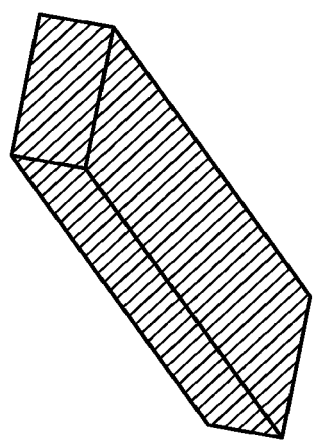
Figure 9C:
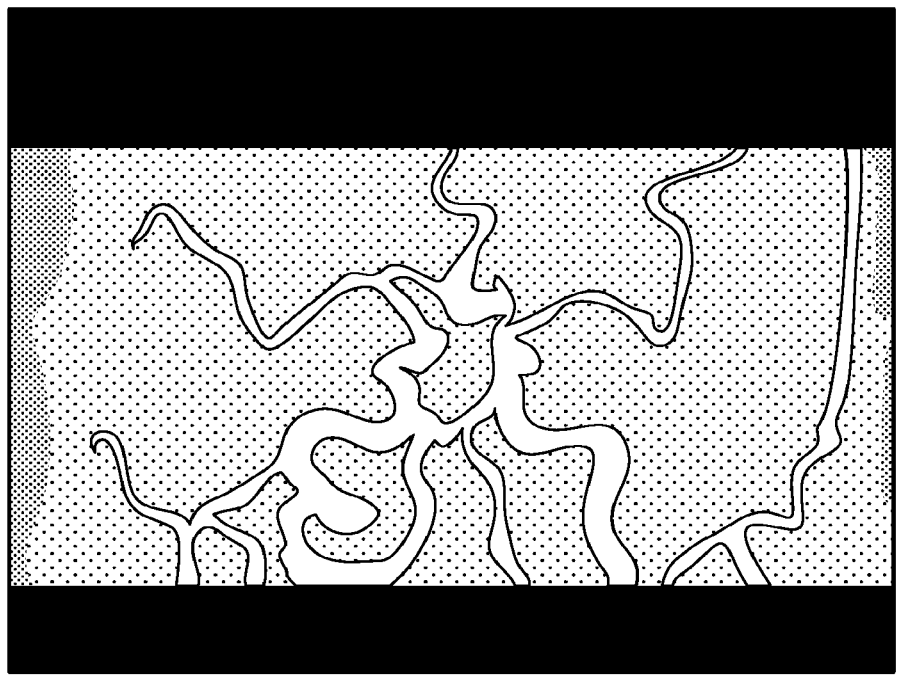
Figure 9D:
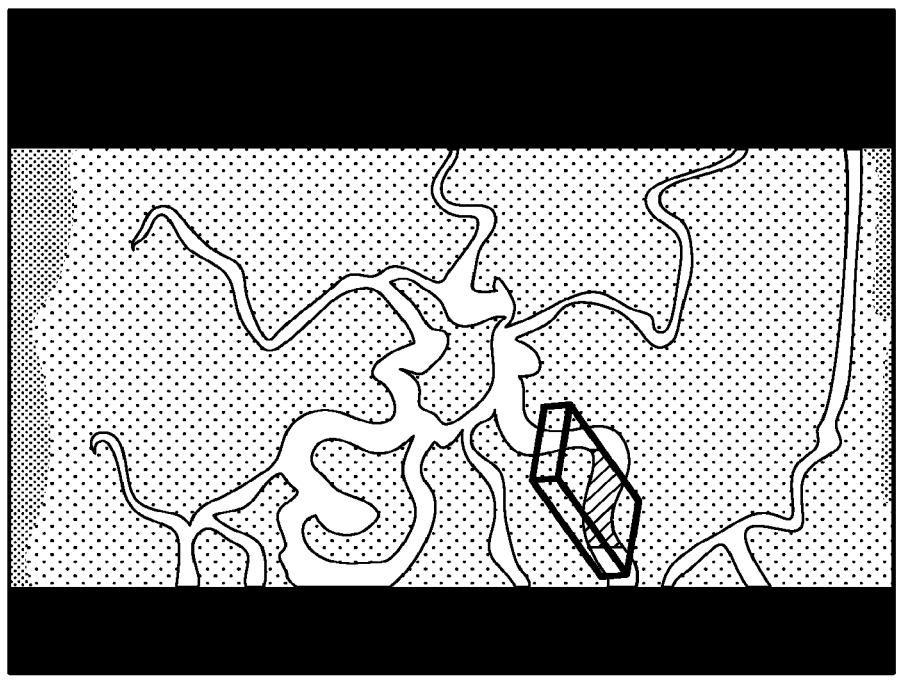

Subsequently, the user sets two ROIs as shown in FIG. 9B in the first image by the ROI setting function 103.

Subsequently, the magnetic resonance imaging apparatus 100A imaging processes, with the first imaging processing function 102, the 3D images obtained by the sequence control circuitry 101 according to the first parameter set for the scanning sequence prescribed in one or more scanning sequences to obtain a first image that highlights the display of constituent parts of the scanning object represented by the first parameter as shown in FIG. 9C. In the first image shown in FIG. 9C, the blood vessel parts indicated by the first parameter set for the prescribed scanning sequence are highlighted while the grey matter, white matter and the harnpan are displayed with certain transparency, by the first imaging processing function 102 of the processing circuitry 150.

Subsequently, the processing circuitry 150 performs, by the second imaging processing function 104, imaging processing to obtain the second image that highlights the intersection region between ROI and the first image as shown in FIG. 9D.

As shown in FIG. 9D, in the second image, in addition to displaying the ROI, the target parts of constituent parts in the scanning object based on the preset second parameter, namely the constituent part, and parts other than the target parts of the constituent parts in the scanning object, namely the constituent part with different transparencies, the intersection region between the ROI and the first image is highlighted by the second imaging processing function 104 of the processing circuitry 150. In other words, the processing circuitry 150 displays, by the second imaging processing function 104 as the display unit, a region in which the translucent region to which the translucent processing is to be performed and the region to which the RF pulse is to be applied intersect.

The third embodiment has the effects of the above-described first and second embodiments and the modifications thereof, which will not be described any more herein.

Modified Example

In the above-described embodiments, detail description has been presented as examples for the case in which the specific embodying forms of the present invention are a magnetic resonance imaging apparatus and a method for operating the same. However, specific embodying forms of the present invention are not limited thereto and may also be various forms such as a magnetic resonance imaging system, a method or an integrated circuit.

In the above-described embodiments, detail description is presented as examples for cases in which the scanning objects of magnetic resonance imaging are brain and torso. However, the scanning object is not limited thereto, and may also be other human organs such as a small joint, the pituitary gland, the abdomen, ligaments, elbow joints, wrist joints and ankle joints.

Figure 10:
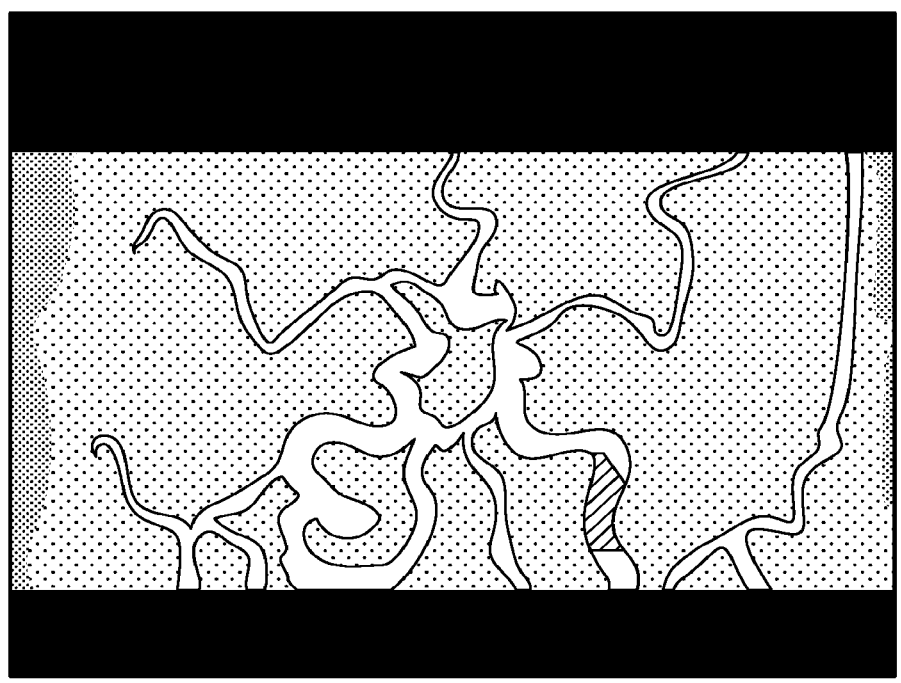
FIG. 10 is an example of a screen that a magnetic resonance imaging apparatus according to an embodiment displays.

In addition, the second image that highlights the intersection region between the ROI and the first image is not limited to the one described in the third embodiment, but also may prompt as shown in FIG. 10. Therefore, in the brain blood vessel 3D rendering image, it is possible to display the intersection region between one side blood vessels and the ROI in the way shown in the section line in the second image such that the user may determine whether the vessels of interest have been accurately located very intuitively for setting operations of application regions of various RF pulses, such as saturation, labeling and tagging.

Further, in the first embodiment, a magnetic resonance imaging apparatus according to an embodiment may change the contents of the highlighted display according as the subsequent scanning sequences, in which case, for example, the magnetic resonance imaging apparatus 100 comprises sequence control circuitry 101 and processing circuitry 150. The sequence control circuitry 101 scans the scan object by one or more scanning sequences to obtain a three-dimensional image. The processing circuitry 150 performs an imaging processing to the three-dimensional image so as to image the first image that displays and highlights the constituent part of the scanning object. Here, the processing circuitry 150 displays and highlights, by the first imaging processing function 102, according as a specific scanning sequence executed subsequent to the one or more scanning sequence.

For example, when the specific scanning sequence is a DWI (Diffusion-weighted Imaging) sequence, when registration, the positions of the soft brain tissues, such as the positions of AC-PC (Anterior Commissure-Posterior Commissure), becomes important. Thus, when the specific scanning sequence is a DWI sequence, the processing circuitry 150 displays and highlights in particular, by the first imaging processing function 102, AC-PC, according as the specific scanning sequence.

Further, for example, when the specific scanning sequence is an ASL (Arterial Spin Labeling) sequence, when registration, the positions of the soft brain tissues, such as the positions of the brain blood vessels, becomes important. Thus, when the specific scanning sequence is an ASL sequence, the processing circuitry 150 displays and highlights in particular, by the first imaging processing function 102, specific brain blood vessels, according as the specific scanning sequence.

As described above, according to a magnetic resonance imaging apparatus according to an embodiment can improve the userbility of an operator. For example, it becomes possible to perform an accurate positioning of the constituent part of the scanning object that is to be operated. Further, it becomes possible to judge accurately the detailed information at an intersection part of the region of interest and the scanning object in the three dimensional image. Further, it becomes possible to accurately judge the relative positional relationship between the region of interest and the constituent part of the scanning object. Further, for example, it becomes possible to provide intuitive detailed information of the view. Further, for example, even when a registration in a complicated anatomical structure or in a tiny region, it becomes possible to locate the region of interest with high precision.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus that executes a first imaging prior to a second imaging, comprising:
    sequence control circuitry configured to execute the first imaging and the second imaging, and
    processing circuitry configured to
        receive, on a first image obtained from the first imaging, a setting of an ROI (region of interest) in the second imaging in which an RF (Radio Frequency) pulse is to be applied to a subject;
        generate a three-dimensional image based on the first image;

determine, based on an imaging purpose of the second imaging, a first region to which translucent processing in the three-dimensional image is to be performed and a second region that is not subject to the translucent processing in the three-dimensional image;

display the first region, making the first region translucent in the three-dimensional image;

display the second region in the ROI to which the RF pulse is to be applied; and display a third region that is an intersection region in which the first region to which the translucent processing is to be performed and the ROI to which the RF pulse is to be applied intersect.

2. The magnetic resonance imaging apparatus according to claim 1, wherein the imaging purpose is a type of imaging sequence used in the second imaging.

3. The magnetic resonance imaging apparatus according to claim 1, wherein the imaging purpose is information of a body part to be imaged in the second imaging.

4. The magnetic resonance imaging apparatus according to claim 1, wherein the imaging purpose is information of an anatomical body part that is an imaging target in the second imaging.

5. The magnetic resonance imaging apparatus according to claim 1, wherein the RF pulse is a saturation pulse suppressing MR (Magnetic resonance) signals generated from a specific tissue.

6. The magnetic resonance imaging apparatus according to claim 1, further comprising:

memory that stores information indicating correspondence between the imaging purpose and the first region, wherein the processing circuitry reads, from the memory, the first region that is chosen according to the imaging purpose in the second imaging.

7. The magnetic resonance imaging apparatus according to claim 1, wherein the first image is a plurality of two-dimensional images each of which is obtained along a plurality of axes, and the processing circuitry receives, in the plurality of two-dimensional image, the setting of the ROI in which the RF pulse is to be applied.

8. The magnetic resonance imaging apparatus according to claim 1, wherein the first image is volume data, and the processing circuitry receives, in the volume data, the setting of the ROI in which the RF pulse is to be applied.

9. The magnetic resonance imaging apparatus according to claim 1, wherein the processing circuitry is configured to display and highlight a different region according to a scanning sequence corresponding to the second imaging, the second imaging is an imaging of a brain, when the scanning sequence corresponding to the second imaging is a DWI (diffusion-weighted imaging) sequence, the processing circuitry is configured to display and highlight AC-PC (Anterior Commissure-Posterior Commissure), and when the scanning sequence corresponding to the second imaging is an ASL (Arterial Spin Labeling) sequence, the processing circuitry is configured to display and highlight brain blood vessels.

10. An image processing method, comprising:

executing a first imaging prior to a second imaging;

receiving, on a first image obtained from the first imaging, a setting of an ROI (region of interest) in the second imaging in which an RF (Radio Frequency) pulse is to be applied to a subject;

generating a three-dimensional image based on the first image;

determining, based on an imaging purpose of the second imaging, a first region to which translucent processing is to be performed in the three-dimensional image and a second region that is not subject to the translucent processing in the three-dimensional image;

displaying the first region, making the first region translucent in the three-dimensional image;

displaying the second region in the ROI to which the RF pulse is to be applied; and displaying a third region that is an intersection region in which the first region to which the translucent processing is to be performed and the ROI to which the RF pulse is to be applied intersect.

11. The image processing method according to claim 10, wherein the imaging purpose is a type of imaging sequence used in the second imaging.

12. The image processing method according to claim 10, wherein the imaging purpose is information of a body part to be imaged in the second imaging.

13. The image processing method according to claim 10, wherein the imaging purpose is information of an anatomical body part that is an imaging target in the second imaging.

14. The image processing method according to claim 10, wherein the RF pulse is a saturation pulse suppressing MR (Magnetic resonance) signals generated from a specific tissue.

15. The image processing method according to claim 10, further comprising:

storing, in a memory, information indicating correspondence between the imaging purpose and the first region; and reading, from the memory, the first region that is chosen according to the imaging purpose in the second imaging.

16. The image processing method according to claim 10, wherein the first image is a plurality of two-dimensional images each of which is obtained along a plurality of axes, and the method includes receiving, in the plurality of two-dimensional image, the setting of the ROI in which the RF pulse is to be applied.

17. The image processing method according to claim 10, wherein the first image is volume data, and the method includes receiving, in the volume data, the setting of the ROI in which the RF pulse is to be applied.

18. The image processing method according to claim 10, wherein the method includes displaying and highlighting a different region according to a scanning sequence corresponding to the second imaging, the second imaging is an imaging of a brain, when the scanning sequence corresponding to the second imaging is a DWI (diffusion-weighted imaging) sequence, the method includes displaying and highlighting AC-PC (Anterior Commissure-Posterior Commissure), and when the scanning sequence corresponding to the second imaging is an ASL (Arterial Spin Labeling) sequence, the method includes displaying and highlighting brain blood vessels.

\* \* \* \* \*